United States Patent
Weber

(10) Patent No.: US 11,648,753 B2
(45) Date of Patent: May 16, 2023

(54) WINDOW PANE HAVING A CAPACITIVE SWITCHING REGION FOR CONTACTLESSLY CONTROLLING A FUNCTION

(71) Applicant: SAINT-GOBAIN GLASS FRANCE, Courbevoie (FR)

(72) Inventor: Patrick Weber, Alsdorf (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 224 days.

(21) Appl. No.: 16/319,025

(22) PCT Filed: May 12, 2017

(86) PCT No.: PCT/EP2017/061430
§ 371 (c)(1),
(2) Date: Jan. 18, 2019

(87) PCT Pub. No.: WO2018/015040
PCT Pub. Date: Jan. 25, 2018

(65) Prior Publication Data
US 2019/0160792 A1    May 30, 2019

(30) Foreign Application Priority Data
Jul. 20, 2016   (EP) .................... 16180280

(51) Int. Cl.
*B32B 17/10* (2006.01)
*B60J 1/00* (2006.01)
*H03K 17/955* (2006.01)

(52) U.S. Cl.
CPC .. *B32B 17/10504* (2013.01); *B32B 17/10036* (2013.01); *B32B 17/10174* (2013.01);
(Continued)

(58) Field of Classification Search
CPC ........ B32B 17/10036; B32B 17/10761; B32B 17/10541; B32B 17/10174;
(Continued)

(56) References Cited

U.S. PATENT DOCUMENTS 7,745,838 B2 *   6/2010   Lefevre ............. B32B 17/10018
257/88
8,405,901 B2 *   3/2013   Boote ............... B32B 17/10788
359/320

(Continued)

FOREIGN PATENT DOCUMENTS

CA       2 944 272 A1    10/2015
EP       0 899 882 A1     3/1999
(Continued)

OTHER PUBLICATIONS

International Search Report as issued in International Patent Application No. PCT/EP2017/061430, dated Aug. 22, 2017.

*Primary Examiner* — Maceeh Anwari
*Assistant Examiner* — Aarron E Santos
(74) *Attorney, Agent, or Firm* — Pillsbury Winthrop Shaw Pittman LLP

(57) ABSTRACT

A window pane has a plurality of capacitive switching regions, for separating an interior from an external environment, wherein the window pane includes a pane having an inner surface and a coating that is arranged at least partially on the inner surface of the pane and a capacitive switching region is in each case electrically separated from the coating by at least one coating-free dividing line and can be electrically connected to a sensor electronics system and has a (Continued)

detection region for contactlessly detecting an object moved by a person in an activation region and the direction of movement thereof.

17 Claims, 5 Drawing Sheets

(52) U.S. Cl.
CPC .. *B32B 17/10192* (2013.01); *B32B 17/10513* (2013.01); *B32B 17/10532* (2013.01); *B32B 17/10761* (2013.01); *B60J 1/00* (2013.01); *H03K 17/955* (2013.01); *H03K 2217/960785* (2013.01)

(58) Field of Classification Search
CPC ........ B32B 17/10192; B32B 2605/006; B32B 17/10788; B32B 17/10385; B32B 2605/08; B32B 15/043; B32B 15/082; B32B 17/061; B32B 2307/702; B32B 3/18; B32B 17/10183; B32B 17/10669; B32B 17/10807; B32B 2307/202; B32B 2315/08; B32B 2367/00; B32B 17/10005; B32B 17/10; H05B 2203/013; H05B 3/84; H05B 2203/014; H05B 2203/017; H05B 1/02; H05B 3/03; H05B 3/12; H05B 3/56; H05B 1/0236; H05B 2203/008; H05B 2203/011; H05B 3/06; H05B 3/86; H05B 2214/02; H05B 6/101; H05B 6/362; H05B 6/44; B60J 7/057; B60J 10/77; B60J 10/84; B60Q 3/82
See application file for complete search history.

(56) References Cited

U.S. PATENT DOCUMENTS

| | | | |
|---|---|---|---|
| 2004/0227625 A1* | 11/2004 | Joehl | B60Q 3/82 340/438 |
| 2008/0202912 A1* | 8/2008 | Boddie | H03K 17/962 200/600 |
| 2009/0046355 A1* | 2/2009 | Derda | B32B 17/10541 359/359 |
| 2009/0283340 A1* | 11/2009 | Liu | H03K 17/9622 178/18.06 |
| 2010/0179725 A1* | 7/2010 | Boote | B32B 17/10 701/36 |
| 2010/0221461 A1* | 9/2010 | Torr | B32B 17/1011 428/34 |
| 2014/0285865 A1* | 9/2014 | McCabe | G02F 1/1533 359/265 |
| 2015/0370140 A1* | 12/2015 | Bertolini | B60J 1/001 359/275 |

FOREIGN PATENT DOCUMENTS

| | | | |
|---|---|---|---|
| EP | 1 477 351 A2 | 11/2004 | |
| EP | 2 969 616 A1 | 1/2016 | |
| JP | 2015-501063 A | 1/2015 | |
| JP | 2017-521337 A | 8/2017 | |
| WO | WO 2008/113978 A1 | 9/2008 | |
| WO | WO-2010032067 A1 * | 3/2010 | ....... G02F 1/134309 |
| WO | WO-2011036010 A1 * | 3/2011 | ....... B32B 17/10669 |
| WO | WO 2013/131667 A1 | 9/2013 | |
| WO | WO-2014020376 A1 * | 2/2014 | ............ G01B 7/003 |
| WO | WO-2014086555 A1 * | 6/2014 | ....... B32B 17/10036 |
| WO | WO 2014/149201 A1 | 9/2014 | |
| WO | WO 2015/162107 A1 | 10/2015 | |
| WO | WO 2015/162108 A1 | 10/2015 | |
| WO | WO-2015162108 A1 * | 10/2015 | ............... H05B 3/06 |

* cited by examiner

WINDOW PANE HAVING A CAPACITIVE SWITCHING REGION FOR CONTACTLESSLY CONTROLLING A FUNCTION

CROSS-REFERENCE TO RELATED APPLICATIONS

This application is the U.S. National Stage of PCT/EP2017/061430, filed May 12, 2017, which in turn claims priority to European patent application number 16180280.6 filed Jul. 20, 2016. The content of these applications are incorporated herein by reference in their entireties.

FIELD

The invention relates to a window pane having a coating and a capacitive switching region, a window pane arrangement, a method for producing the window pane, and use thereof.

BACKGROUND

An interior of a motor vehicle is nowadays usually designed with a panoramic roof as a roof. A panoramic roof has a composite structure that comprises a transparent vehicle window pane. In the summer, in the case of intense direct sunlight, the vehicle can heat up greatly. In the winter, in the case of a low outside temperature, the vehicle window pane acts as a heat sink and the vehicle interior can cool uncomfortably. For cooling in the summer and heating in the winter, an air conditioning system of the vehicle can produce high thermal output to avoid heating or cooling of the interior via the vehicle window panes.

For avoiding excessive heating of the interior, vehicle window panes are equipped with a coating that reflects thermal radiation. These so-called low-E coatings are known, for example, from WO 2013/131667 A1. Such a low-E-coating reflects a significant part of the solar radiation, in particular in the infrared range, resulting, in the summer, in reduced heating of the vehicle interior.

It is further known that a coated window pane can additionally have a switching region for controlling a function, for example, a heating function. Such switching regions can be implemented by a surface electrode or by an arrangement of two coupled electrodes, for example, as a capacitive switching region. When an object approaches the switching region, the capacitance of the surface electrode against ground or the capacitance of the capacitor formed by the two coupled electrodes changes. The capacitance change is measured by a circuit arrangement or a sensor electronics system; and when a threshold value is exceeded, a switching signal is triggered. Circuit arrangements for capacitive switches are known, for example, from EP 0 899 882 A1. According to the prior art, a switching signal is triggered in that a contact surface of the capacitive switching region is touched by a human hand. Touching the vehicle window pane leaves behind fouling in the form of fingerprints and other particles that can adversely affect the functionality of the switching region.

SUMMARY

The object of the present invention consists in providing an improved window pane having a capacitive switching region actuation of which does not foul the window pane.

The object of the present invention is accomplished according to the invention by a window pane having a plurality of capacitive switching regions in accordance with the independent claim 1. Preferred embodiments are apparent from the dependent claims.

The window pane according to the invention having a plurality of capacitive switching regions, for separating an interior from an external environment, comprises a pane having an inner surface and a coating that is arranged at least partially on the inner surface of the pane, wherein a capacitive switching region is in each case electrically separated from the coating by at least one coating-free dividing line, and can be electrically connected to a sensor electronics system and has a detection region for contactlessly detecting an object moved by a person in an activation region and the direction of movement thereof.

In the context of the invention, there is contactless detection of a person, preferably of a hand or an object with similar permittivity behavior, when the person, the hand, or the object is detected by the detection region without physical contact with the window pane. In other words, when the capacitive switching region generates an electrical signal, i.e., electrical charge transport from the switching region to the sensor electronics system occurs without the window pane having been touched by the person, the hand, or the object.

Such a capacitive switching region enables controlling a function based on the proximity of the person, the hand, or the object. As a result of the contactless detection of a moved object, there is no fouling of the windowpane by the object and the function of the capacitive switching region is not adversely affected.

The window pane can be used in many ways: In the case of a window pane as a vehicle windowpane, it can, for example, be a roof panel, a windshield, a rear window, a side window pane, or another glazing delimiting the vehicle interior. Here, "outer surface" of the pane means the surface of the pane that faces outward, i.e., away from the vehicle interior. Accordingly, "inner surface" means the surface of the pane that faces the interior.

In the case of a window pane as an architectural pane or as structural glazing, the window pane can, for example, be a façade glazing, a roof panel, or another glazing delimiting a living space or building interior. Here, "outer surface" of the pane means the surface of the pane that faces outward, i.e., away from the interior. Accordingly, "inner surface" means the surface of the pane that faces the interior.

The inner surface has a so-called "low-E coating" as a coating. Then, the outer surface is the surface of the pane opposite the inner surface.

The so-called "low-E coating" includes at least one functional layer and, optionally, in each case, one or a plurality of adhesive layers, barrier layers, and/or antireflection layers. The low-E coating is preferably a layer system comprising at least one adhesive layer, one functional layer, one barrier layer, one antireflection layer, and another barrier layer in each case. Particularly suitable low-E coatings contain a functional layer of at least one electrically conductive oxide (TCO), preferably indium tin oxide (ITO), fluorine-doped tin oxide ($SnO_2$:F), antimony-doped tin oxide ($SnO_2$:Sb), aluminum-doped zinc oxide (ZnO:Al), and/or gallium-doped zinc oxide (ZnO:Ga).

Particularly advantageous low-E coatings according to the invention have an interior-side emissivity of the window pane according to the invention less than or equal to 60%, preferably less than or equal to 45%, particularly preferably less than or equal to 30%, and in particular less than or equal to 20%. Here, "interior-side emissivity" is the measurement that indicates how much thermal radiation the pane gives off in the installed position compared to an ideal thermal radiator (a black body) into an interior, for example, of a building or of a vehicle. In the context of the invention, "emissivity" means the total normal emissivity at 283 K pursuant to the standard EN 12898.

The sheet resistance of the low-E coating can be from 10 ohm/square to 200 ohm/square and preferably from 10 ohm/square to 100 ohm/square, particularly preferably from 15 ohm/square to 50 ohm/square, and in particular from 20 ohm/square to 35 ohm/square.

The absorption of the low-E coating according to the invention in the visible spectral range is preferably approx. 1% to approx. 15%, particularly preferably approx. 1% to approx. 7%. The absorption of the coating can be determined by measuring the absorption of a coated pane and subtracting the absorption of the uncoated pane. The pane according to the invention preferably has, in reflection, a color value a* of −15 to +5 and a color value b* of −15 to +5, observed from the side provided with the low-E coating. The data a* and b* are based on the color coordinates of the colorimetric model (L*a*b*-color space).

Also, the low-E coating can have, in the visible spectral range, low absorption and low reflection and, consequently, high transmittance. The low-E coating can, consequently, also be used on panes for which a significant reduction in transmittance is undesirable, for example, for window panes in buildings, or legally forbidden, for example, for windshields or front side windows in motor vehicles.

The low-E coating has the advantage of being corrosion resistant. The low-E coating can, consequently, be applied on the surface of the pane that is intended, in the installed position of the pane, to face an interior, for example, of a vehicle or of a building. On this surface, the low-E coating particularly effectively reduces the emission of thermal radiation from the pane into the interior in the summer and the outward emission of heat into the exterior environment in the winter.

Such low-E coatings are particularly suited, in the case of roof glazings, to offer the vehicle owner enough thermal comfort so that the use and mechanical rollup sunshade can be dispensed with.

The functional layer has reflective properties for thermal radiation, in particular infrared radiation, but is largely transparent in the visible spectral range. According to the invention, the functional layer includes at least one transparent, electrically conductive oxide (TCO). The refractive index of the material of the functional layer is preferably from 1.7 to 2.5. The functional layer preferably contains at least indium tin oxide (ITO). Thus, particularly good results are achieved in terms of the emissivity and the flexibility of the coating according to the invention.

The indium tin oxide is preferably deposited using magnetron enhanced cathodic sputtering with a target of indium tin oxide. The target preferably contains from 75 wt.-% to 95 wt.-% indium oxide and from 5 wt.-% to 25 wt.-% tin oxide as well as production-related admixtures. The deposition of the indium tin oxide is preferably done under a protective gas atmosphere, for example, argon. A small amount of oxygen can be added to the protective gas, for example, to improve the homogeneity of the functional layer.

Alternatively, the target can preferably contain at least from 75 wt.-% to 95 wt.-% indium and from 5 wt.-% to 25 wt.-% tin. The deposition of the indium tin oxide is preferably done with the addition of oxygen as a reaction gas during the cathodic sputtering.

The emissivity of the pane according to the invention can be influenced by the thickness of the functional layer. The thickness of the functional layer is preferably from 40 nm to 200 nm, particularly preferably from 90 nm to 150 nm, and most particularly preferably from 100 nm to 130 nm, for example, approx. 120 nm. In this range for the thickness of the functional layer, particularly advantageous values for emissivity and a particularly advantageous capability of the functional layer to withstand a mechanical transformation such as bending or tempering without damage are obtained.

The functional layer can, however, also include other transparent, electrically conductive oxides, for example, fluorine-doped tin oxide ($SnO_2$:F), antimony-doped tin oxide ($SnO_2$:Sb), indium-zinc mixed oxide (IZO), gallium-doped or aluminum-doped zinc oxide, niobium-doped titanium oxide, cadmium stannate, and/or zinc stannate.

The antireflection layer reduces reflections in the visible spectral range on the window pane according to the invention. In particular, by means of the antireflection layer, high transmittance through the window pane according to the invention is obtained in the visible spectral range, as well as a neutral color impression of reflected and transmitted light. The antireflection layer also improves the corrosion resistance of the functional layer. The material of the antireflection layer preferably has a refractive index smaller than the refractive index of the material of the functional layer. The refractive index of the material of the antireflection layer is preferably less than or equal to 1.8.

Exemplary layer systems that are suitable as low-E coatings as well as methods for their production are known, for example, from WO 2013/131667 A1.

In the window pane according to the invention, a plurality of capacitive switching regions are electrically separated out of the low-E coating by at least one coating-free dividing line. This means that the regions separated by the dividing line are electrically isolated from one another. The regions separated by the dividing line are advantageously galvanically isolated from one another.

According to a preferred embodiment, the detection region is provided for generating an electric field. The electric field extends within the activation region. If an object is moved into the activation region, the object causes a change in the electric field that is detected by the capacitive switching region. This change is dependent on the position of the object such that a detection of the position is also possible.

The capacitive switching regions of a window pane according to the invention can be used for electrically controlling a function within or outside the window pane or composite pane, preferably a change in the optical transparency of a functional intermediate layer, in particular a suspended particle device (SPD) layer, a polymer dispersed liquid crystal (PDLC) layer, or an electrochromic intermediate layer, of the a heating function of a window pane, of an illumination, in particular of a lighting means arranged on or in the window pane, such as an LED.

The change in transparency can occur in steps. It is thus possible to even realize gradual solar protection and to dispense with installation of a conventional, mechanical rollup sunshade.

It is particularly advantageous that the detection region can detect the object and the direction of its movement. Thus, not only a change in transparency is effected, but the direction of the change is also detected. Thus, a person's swiping gesture along the window pane in a first direction can cause stepwise darkening and a person's swiping gesture in the opposite direction can cause a reduction in the darkening.

Preferably, the detection region is implemented in at least two strip-shaped subregions whose length is significantly greater than their width. As a result, the activation region is expanded and the sensitivity of the capacitive switching region is increased.

Division of the detection region into a plurality of subregions enables detection of an object as a function of its position.

In such an arrangement, two adjacent subregions form, in each case, two electrodes that are capacitively coupled to one another. The capacitance of the capacitor formed by the electrodes changes with the approach of an object, preferably a human hand. The capacitance change is measured by a sensor electronics system and when a threshold value is exceeded, a switching signal is triggered. The sensitive region is defined by the shape and size of the region in which the electrodes are capacitively coupled. One of the two adjacent subregions can be coupled to a ground potential.

The subregions can be arranged at a coating-free distance corresponding to the width of the dividing line. A longitudinal axis of the subregions can run parallel to one side of the inner surface. A subregion can have a length that corresponds to one side of the inner surface. In particular, the length of the subregion can correspond to the width of the inner surface. The respective width of a subregion can be constant. Alternatively, the width of the subregion can vary. By means of a parallel arrangement of the subregions, virtually the entire inner surface can serve as a detection region. The subregion coupled to a ground potential can have a substantially smaller width than its adjacent subregion. Thus, for example, a subregion can be implemented approx. 10 times wider than its adjacent subregion coupled to a ground potential.

Through the arrangement of the subregions, it is possible for the activation region to extend over an region parallel to the inner surface in the direction of the interior. The activation region can preferably have a width less than or equal to 10 cm. With the help of the activation region provided, an object, for example, a human hand, can be detected contactlessly and a signal can be generated.

The capacitive switching region according to the invention can have a detection region, a supply line region, and a connection region, wherein the supply line region electrically connects the detection region to the connection region and the connection region can be electrically connected to a sensor electronics system.

In an advantageous embodiment of the invention, the ratio of the length to the width of the supply line region is less than or equal to 1:700 and preferably 1:3 to 1:100. In the context of the present invention, if the supply line region does not have a constant width, for example, if it is implemented in the shape of a trapezoid or a drop, "width" means the average width of the supply line region.

The length of the supply line region is from 1 cm to 70 cm, preferably from 1 cm to 12 cm, and in particular from 3 cm to 8 cm. The width of the supply line region is preferably from 0.5 mm to 10 mm and particularly preferably from 0.5 mm to 2 mm. The shape of the supply line region is preferably rectangular, strip-shaped, or line-shaped. The supply line region can be rectilinear, but also curved, angled, L-shaped, U-shaped, or have any desired curvilinear shape. The supply line region can thus be adapted in a simple manner to the respective circumstances of the pane, such as the low-E coating-free zones and can, for example, bypass them.

The detection region can, in principle, have any desired shape. Particularly suitable detection regions are drop-shaped. Alternatively, angled shapes are possible, for example, triangles, squares, rectangles, trapezoids, or other types of quadrilaterals or higher order polygons. Rounded corners are particularly advantageous. This applies in the transitional region between the detection region and the supply line region and/or the supply line region and the connection region. It is particularly advantageous for the corners to have a radius of curvature of at least 3 mm, preferably of at least 8 mm.

In an advantageous embodiment of the pane arrangement according to the invention, the width $t_1$ of the dividing lines is from 30 µm to 200 µm and preferably from 70 µm to 140 µm. Such thin dividing lines enable reliable and sufficiently high electrical isolation and, at the same time, interfere only slightly or not at all with vision through the composite pane.

In an advantageous embodiment, the switching region forms a surface electrode. The capacitance of the surface electrode is measured by an external capacitive sensor electronics system. The capacitance of the surface electrode changes against ground when a suitable object (preferably a human hand) comes into its proximity. The capacitance change is measured by the sensor electronics system; and when a threshold value is exceeded, a switching signal is triggered. The switching region is defined by the shape and size of the surface electrode.

The region of the low-E coating that is arranged outside the capacitive switching region—referred to in the following as "surrounding region"—is or can be connected to the sensor electronics system via another connection region. The surrounding region can include the entire low-E coating outside the capacitive switching region. Alternatively, the surrounding region can be isolated from the entire low-E coating by one or a plurality of dividing lines and electrically isolated from the capacitive switching region and the surrounding low-E coating. The dividing line that borders the capacitive switching region and isolates the surrounding region from the remaining low-E coating arranged surrounding it preferably has a distance of 0.1 mm to 200 cm, particularly preferably of 0.5 mm to 100 mm, and, in particular, a distance of 1 mm to 11 mm. The distance thus corresponds to the width of the surrounding region. The surrounding region can border all capacitive switching regions, in each case an individual capacitive switching region or individual groups of capacitive switching regions.

The capacitive switching region according to the invention and, optionally, the surrounding region are integrated into the window pane according to the invention. Thus, no switch or the like is necessary as a separate component that has to be mounted on the window pane. The window pane preferably also has no other components that are arranged on its surfaces in the through-vision region. This is particularly advantageous in terms of a thin design of the window pane as well as only slight disruption of the vision through the window pane.

Another aspect of the invention comprises a composite pane having a capacitive switching region and a coating, at least comprising:

- one inner pane that consists of the pane according to the invention having a capacitive switching region and the coating,
- one outer pane having an inner surface, and
- at least one intermediate layer that joins the inner surface of the outer pane areally to an outer surface of the inner pane.

The inner surface of the composite pane thus corresponds to the inner surface of the inner pane (i.e., the pane according to the invention), and the outer surface of the composite pane corresponds to the outer surface of the outer pane.

In the case of a composite pane, the inner pane and the outer pane are joined to one another by at least one intermediate layer. The intermediate layer is preferably transparent. The intermediate layer preferably contains at least one plastic, preferably polyvinyl butyral (PVB), ethylene vinyl acetate (EVA), and/or polyethylene terephthalate (PET). The intermediate layer can, however, also contain, for example, polyurethane (PU), polypropylene (PP), polyacrylate, polyethylene (PE), polycarbonate (PC), polymethyl methacrylate, polyvinyl chloride, polyacetate resin, casting resins, acrylates, fluorinated ethylene propylenes, polyvinyl fluoride, and/or ethylene tetrafluoroethylene, or copolymers or mixtures thereof. The intermediate layer can be formed by one or even a plurality of films arranged one atop another, wherein the thickness of a film is preferably from 0.025 mm to 1 mm, typically 0.38 mm or 0.76 mm. The intermediate layers can preferably be thermoplastic and, after lamination, adhesively bond the inner pane, the outer pane, and possible additional intermediate layers to one another. The intermediate layer preferably has relative permittivity from 2 to 4 and particularly preferably from 2.1 to 2.9.

An advantageous aspect of the invention includes a pane arrangement with a window pane according to the invention or a composite pane according to the invention and a sensor electronics system that is electrically connected via the connection region to the capacitive switching region and, optionally, via another connection region to the surrounding surface. The sensor electronics system is a capacitive sensor electronics system.

In an advantageous embodiment of the switching arrangement according to the invention, the sensitivity of the sensor electronics system is selected such that upon detection of an object moved by a person in an activation region, the sensor electronics system generates a switching signal.

Of course, the detection region can also detect multiple fingers or a different human body part. In the context of this invention, "detection" means any interaction with the switching region that results in a measurable change of the measurement signal, i.e., in this case, the capacitance.

The switching signal emitted can be adapted as desired and to the requirements of the respective use. Thus, the switching signal can mean a positive voltage, for example, 12 V, no switching signal can mean, for example, 0 V, and another switching signal can mean, for example, +6 V. The switching signals can also correspond to the voltages CAN_High and CAN_Low customary with a CAN-bus and change by a voltage value between them. The switching signal can also be pulsed and/or digitally coded.

The particular advantage of such a pane arrangement according to the invention resides in that the switching signal requires no contacting of the window pane or of the composite pane.

The sensitivity of the sensor electronics system can be determined as a function of the size of the detection region and as a function of the geometry as well as the ratio between the width and the length of the supply line region in the context of simple experiments. It is particularly advantageous for the width of the supply line region to be selected as small as possible. In particular, a change in the comparative capacitance of the connected sensor electronics also results in strong sensitization of the switching region.

In an advantageous improvement of a pane arrangement according to the invention, the connection region is connected to a flat conductor, a metal wire, in particular a round conductor or a stranded conductor, and is routed away from the pane surface. The integrated pane arrangement can then be particularly simply connected, at the site of use, to a voltage source and to a signal line, which evaluates the switching signal of the sensor circuit, for example, in a vehicle, via a CAN-bus.

In principle, all electrically insulating substrates that are thermally and chemically stable as well as dimensionally stable under the conditions of production and use of the window pane or composite pane according to the invention are suitable as a pane or inner pane and outer pane.

The pane or the inner pane and the outer pane preferably contain glass, particularly preferably flat glass, float glass, quartz glass, borosilicate glass, soda lime glass, or clear plastics, preferably rigid clear plastics, in particular polyethylene, polypropylene, polycarbonate, polymethyl methacrylate, polystyrene, polyamide, polyester, polyvinyl chloride, and/or mixtures thereof. The pane or the inner pane and the outer pane are preferably transparent, in particular for the use of the pane as a windshield or rear window of a vehicle or other uses where high light transmittance is desired. In the context of the invention, "transparent" refers to a pane that has transmittance greater than 70% in the visible spectral range. However, for panes that are not situated in the traffic-relevant field of vision of the driver, for example, for roof panels, the transmittance can also be much lower, for example, greater than 5%.

The thickness of the pane or of the inner pane and of the outer pane can vary widely and thus be ideally adapted to the requirements of the individual case, in particular in order to realize asymmetric switching. Preferably, standard thicknesses from 1.0 mm to 25 mm, preferably from 1.4 mm to 2.5 mm are used for vehicle glass and, preferably, from 4 mm to 25 mm for furniture, appliances, and buildings. The size of the window pane and of the composite pane can vary widely and is governed by the size of the use according to the invention. The window pane and the composite pane have, for example, in motor vehicle engineering and the architectural sector, customary areas of 200 cm$^2$ up to 20 m$^2$.

The window pane or composite pane can have any three-dimensional shape. Preferably, the three-dimensional shape has no shadow zones such that it can, for example, be coated by cathodic sputtering. Preferably, the panes are planar or slightly or greatly curved in one or a plurality of spatial directions. In particular, planar panes are used. The panes can be colorless or colored.

The pane or the inner pane and the outer pane preferably have relative permittivity $\varepsilon_{r,1/4}$, from 2 to 8 and particularly preferably from 6 to 8.

In an advantageous embodiment of the window pane according to the invention or the composite pane according to the invention, the connection region is arranged at the outer edge of the pane. The distance from the outer edge is preferably less than 10 cm, particularly preferably less than 0.5 cm. This enables electrical contacting of the connection region, for example, with a foil conductor, under an optically inconspicuous black imprint or with a covering.

The electrical supply line is preferably implemented as a foil conductor or a flexible foil conductor (flat conductor, flat band conductor). The term "foil conductor" means an electrical conductor whose width is significantly greater than its thickness. Such a foil conductor is, for example, a strip or band containing or made of copper, tinned copper, aluminum, silver, gold, or alloys thereof. The foil conductor has, for example, a width of 2 mm to 16 mm and a thickness of 0.03 mm to 0.1 mm. The foil conductor can have an insulating sheathing, preferably polymeric, for example, based on polyimide. Foil conductors that are suitable for the contacting of electrically conductive coatings in panes, have a total thickness of, for example, only 0.3 mm. Such thin foil conductors can be arranged simply and aesthetically on the inner surface and, for example, glued on. Multiple conductive layers electrically isolated from one another can be situated in a foil conductor strip.

The electrical line connection between the connection region and the electrical supply line is preferably done via electrically conductive adhesives, which enabled a reliable and durable electrical line connection between the connection region and the supply line. Alternatively, the electrical line connection can also be made by clamps or spring contacts. Alternatively, the supply line can also be printed onto the connection region, for example, by means of a fired metal-containing and in particular silver-containing, electrically conductive printing paste or soldering, in particular ultrasonic soldering.

In an advantageous embodiment of the window pane or composite pane according to the invention, the detection region is directly markable or marked by an active, dimmable light source, preferably by a light-emitting diode (LED), an organic light-emitting diode (OLED), or other active luminary, such as a luminescent material, preferably a florescent or phosphorescent material.

The light source preferably includes an LED or OLED. The particular advantage resides in the small dimensions and the low power consumption. The wavelength range emitted by the light source can be selected freely in the range of visible light, for example, based on practical and/or aesthetic considerations.

The light means can be arranged at any location of the pane or of the inner pane or the outer pane, in particular above a seat and on the side edge of the window pane or composite pane or in a small recess in the center of the inner pane and outer pane. Preferably, the light source is arranged centrally in the detection region.

Another aspect of the invention includes a method for producing a window pane having a capacitive switching region, at least comprising:

(a) Applying a coating on an inner surface of a pane, (b) Introducing at least one dividing line that electrically divides the coating into a plurality of capacitive switching regions and/or at least one surrounding region, preferably by laser patterning or by mechanical or chemical ablation.

In an alternative embodiment of the method according to the invention for producing a composite pane having a capacitive switching region, the process steps a) and b) can also be interchanged.

The application of the coating can be done by methods known per se, preferably by magnetron enhanced cathodic sputtering. This is particularly advantageous in terms of simple, quick, economical, and uniform coating of the panes. However, the electrically conductive layer can also be applied, for example, by vapor deposition, chemical vapor deposition (CVD), plasma-enhanced chemical vapor deposition (PECVD), or by wet chemical processes.

The decoating of individual dividing lines in the coating is preferably done by a laser beam.

The lamination, i.e., the joining of the inner pane, intermediate layer, and outer pane is preferably done under the action of heat, vacuum, and/or pressure. Methods known per se for producing a composite pane can be used.

Another aspect of the invention includes the use of the window pane or composite pane according to the invention with a capacitive switching region in buildings, in particular in the access area, window area, roof area, or façade area, as a built-in component in furniture and appliances, in means of transportation for travel on land, in the air, or on water, in particular in trains, watercraft, and motor vehicles, for example, as a windshield, rear window, side window, and/or roof panel.

Another aspect of the invention includes the use of the window pane according to the invention having a plurality of capacitive switching regions or of the composite pane for electrically controlling a function inside or outside the composite pane, preferably a heating function, lighting, in particular an illumination means arranged in the composite pane, such as an LED, a change in the optical transparency of a functional intermediate layer, in particular of a suspended particle device (SPD) layer or of an electrochromic intermediate layer.

BRIEF DESCRIPTION OF THE DRAWINGS

In the following, the invention is explained in detail with reference to drawings and exemplary embodiments. The drawings are schematic representations and not true to scale. The drawings in no way restrict the invention.

They depict.

DETAILED DESCRIPTION

Figure 1A:
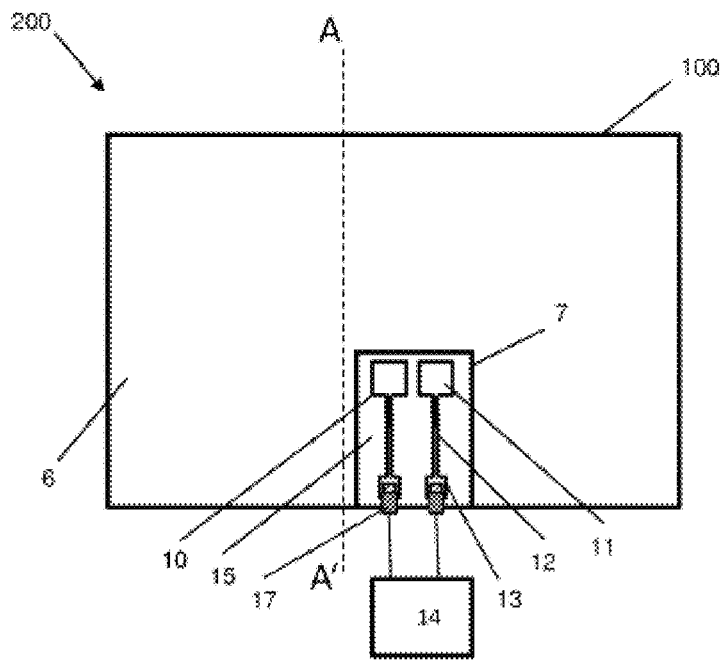
FIG. 1A a plan view of an embodiment of a pane arrangement according to the invention having a window pane according to the invention.

FIG. 1A depicts a plan view of an exemplary embodiment of a pane arrangement 200 according to the invention having a window pane 100 according to the invention using the example of a roof panel of a motor vehicle.

The window pane 100 has a coating 6 over almost its entire surface. The coating 6 is a so-called low-E coating 6 that is divided by coating-free dividing lines 7 into different regions electrically isolated from one another. In this example, "electrically isolated" means that the regions are galvanically separated from one another, in other words, no direct current (DC) can flow between the regions.

The dividing line 7 has a width, for example, of only 100 µm and is, for example, introduced into the low-E coating 6 by laser patterning. Dividing lines 7 with such a narrow width are hardly perceivable visually and disrupt the view through the window pane 100 only slightly, which is particularly aesthetic and is, particularly for use in the field of vision of vehicles, of particular importance for driving safety.

In the lower section of the window pane 100, the low-E coating 6 has, for example, two capacitive switching regions 10. The two capacitive switching regions 10 are electrically divided by a common surrounding region 15. Each switching region 10 comprises a detection region 11, which is approx. square and transitions into a strip-shaped supply line region 12. The width and the length of the detection region 11 is, for example, 40 mm, in each case.

The capacitive switching region 10 generates an electric field that extends within an activation region. The activation region is arranged over an area parallel to the inner surface and extends in the direction of the interior. The activation region can preferably have a width less than or equal to 10 cm in the direction of the interior. With the help of the activation region provided, an object, for example, a human hand, can be contactlessly detected and a signal can be generated. When an object is moved into the activation region, the object causes a change in the electric field that is detected by the capacitive switching region.

The width of the supply line region 12 is, for example, 1 mm. The supply line region 12 is connected to a connection region 13. The connection region 13 has a rectangular, in particular a square shape and an edge length of, for example, 12 mm. The length of the supply line region is approx. 48 mm. The surrounding region 15 is, in turn, separated from the remaining low-E coating 6 by a dividing line 7. Here, the surrounding region 15 is rectangular and surrounds both capacitive switching regions 10.

The connection region 13 is electrically conductingly connected to a foil conductor 17 via an electrical line connection. Here, a reliable electrically conducting connection is preferably achieved by means of an electrically conductive adhesive. The foil conductor 17 is made, for example, from a 50-µm-thick copper foil and is, for example, insulated outside the connection region 13 with a polyimide layer. As a result, the foil conductor 17 can be routed out without an electrical short circuit beyond the surrounding region 15 via the lower edge of the window pane 100. Of course, the electrical line connection of the connection region can be routed outward either via insulated wires or via a region in which the low-E coating of the surrounding region is interrupted.

Here, the foil conductor 17 is, for example, connected, outside the window pane 100, to a capacitive sensor electronics system 14. The sensor electronics system 14 is suited for precisely measuring capacitance changes of the switching region 10 relative to the surrounding region 15 and for relaying a switching signal, for example, to the CAN-bus of a vehicle as a function of a threshold value. Any functions in the vehicle can be switched via the switching signal. For example, lighting in or on the window pane 100 can be switched on or off.

When the window pane 100 is, for example, used as a roof panel in a motor vehicle, the length of the supply line region 12 can be selected such that the driver of the vehicle, the front-seat passenger, or back-seat occupants of the vehicle conveniently reach the detection region 11 of the switching region 10.

Figure 2:
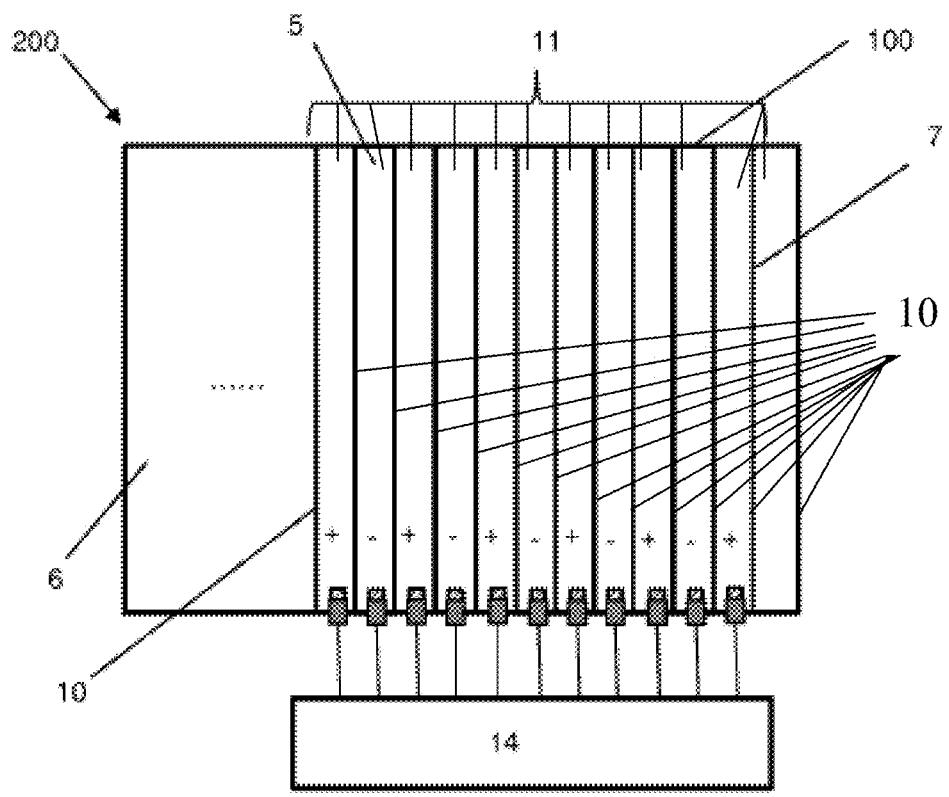
FIG. 2 a plan view of an alternative embodiment of a arrangement according to the invention having a plurality of capacitive switching regions.

In the exemplary embodiment depicted, the structure and tuning of the sensor electronics system 14 is coordinated such that upon a movement of a hand within the activation region, i.e., in the vicinity of the inner surface in FIG. 2 of the pane 1 via the detection region 11 of the capacitance switching region 10, a switching signal is triggered.

Figure 1B:
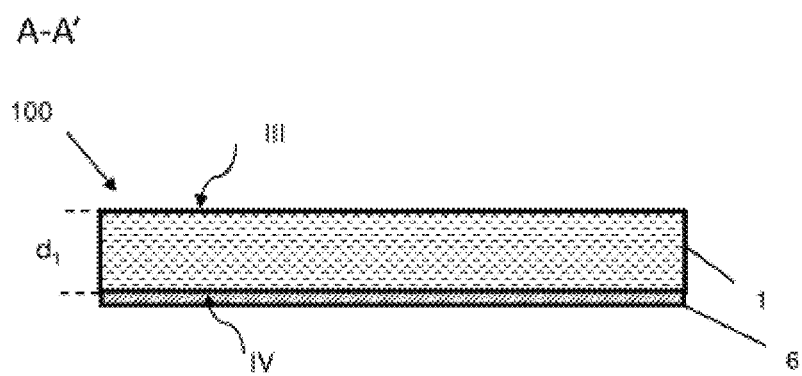
FIG. 1B a cross-sectional view along the section line A-A of FIG. 1A.

FIG. 1B depicts a cross-section along the section line A-A' of FIG. 1A. Here, the window pane 100 comprises, for example, a single pane 1. The window pane 100 is, for example, a vehicle window and, in particular, the roof panel of a passenger car. The dimensions of the window pane 100 are, for example, 0.9 m×1.5 m. The window pane 100 includes a pane 1, which is provided, for example, in the installed position, to separate a vehicle interior from an external environment. In other words, the inner surface IV of the pane 1 is accessible from the inside, whereas, in contrast, the outer surface III of the pane 1 faces outward relative to the vehicle interior. The pane 1 is made, for example, of soda lime glass and was produced in the float method. The thickness $d_1$ of the pane 1 is, for example, 2.1 mm. In principle, the pane 1 can also have different thicknesses. Thus, the pane 1 can have, for example, as structural glazing, a thickness of 4 mm.

The inner surface IV of the pane 1 is coated with a low-E coating 6. Table 1 presents three examples of low-E coatings 6 according to the invention with functional layers made, for example, of ITO. Each low-E coating 6 of the examples 1-3 consists of a layer stack comprising: pane 1/adhesive layer/functional layer/barrier layer/antireflection layer.

TABLE 1

| | | Thickness | | |
|---|---|---|---|---|
| | Material | Example 1 | Example 2 | Example 3 |
| Antireflection layer | $SiO_2$:Al | 45 nm | 40 nm | 80 nm |
| Barrier layer | $Si_3N_4$:Al | 12 nm | 20 nm | 12 nm |
| Functional layer | ITO | 120 nm | 120 nm | 120 nm |
| Adhesive layer | $SiO_2$:Al | 30 nm | 30 nm | 40 nm |
| Pane or inner pane 1 | Soda lime glass | | | |

The low-E coating 6 depicted in FIG. 1B consists, for example, of the layer system of Example 1 of Table 1. In another example, the low-E coating 6 consists of the layer system of Example 2 of Table 1, and consists, in another example, of the layer system of Example 3 of Table 1.

The window pane 1 with the layer systems mentioned by way of example of Example 1-3 have interior-side, normal total emissivity less than or equal to 30% and sheet resistance of 20 ohm/square to 30 ohm/square. The window pane according to the invention has, in reflection, for example, a color value a* of −3 to +4 and a color value b* of −7 to +4, viewed from the side provided with the low-E coating 6 according to the invention. The data a* and b* are based on the color coordinates of the colorimetric model (L*a*b*-color space).

Such a window pane 1 according to the invention can be clear and have, for example, transparency greater than or equal to 80% in the visible range. To avoid glare in the visible range from sunlight, the pane 1 also can be highly tinted and only have transparency less than or equal to 20% in the visible range. Of course, the low-E coating 6 can also consist of different layer systems with low emissivity.

FIG. 2 depicts a plan view of an alternative embodiment of the pane arrangement 200 according to the invention having a plurality of capacitive switching regions 10. The exemplary embodiment depicted corresponds substantially in structure to the window pane 100 according to the invention of FIG. 1A such that only the respective differences are discussed in the following.

The capacitive switching regions 10 of the window pane 100 control the optical transparency of a functional intermediate layer of the pane arrangement 200, in particular of a suspended particle device (SPD) layer, of a polymer dispersed liquid crystal (PDLC) layer, or of an electrochromic intermediate layer.

The detection region 11 is divided in this example into a plurality of elongated subregions 5. The subregions 5 are strip-shaped over almost the entire inner surface of the window pane 100. One subregion 5 can have a width of 2 cm to 0.3 cm. Alternatively, each subregion 5 can have a length that extends over one half the width of the window pane 100 such that the window pane 100 has two separate detection regions 11. The separate detection regions 11 have in each case a sensor circuit, which can be individually assigned to each subregion 5.

Each subregion 5 is electrically conductingly connected to a foil conductor 17 via an electrical line connection. One subregion 5 can be coupled to a ground potential via the foil conductor 17, with its directly adjacent subregion 5 connected to an electrical potential via the foil conductor 17. The foil conductors 17 are connected outside the window pane 100 to the capacitive sensor electronics system 14. Division of the detection region into a plurality of subregions 5 enables detection of an object as a function of its position.

The electric field extends within the activation region almost over the entire inner surface of the window pane 100 in the direction of the interior. As a result of the strip-shaped design of the subregions 5, the activation area is expanded and the sensitivity of the capacitive switching region is increased.

When an object, preferably a hand, moves into the activation region, the object causes a change in the electric field that is detected by the capacitive switching region. This change is dependent on the position of the object such that detection of the position is possible. As a result of the advantageous design of the subregions 5 in strip shape, the change in transparency occurs in steps, wherein a step can correspond to a subregion 5.

The detection region 11 detects the object and its direction of movement. Thus, not only a change in transparency results, but also the direction of the change is detected. Consequently, a person's swiping gesture along the window pane in a first direction can cause stepwise darkening and a person's swiping gesture in the opposite direction can cause a reduction in the darkening.

In an alternative embodiment of the window pane 100 according to the invention, the capacitive switching region 10 controls the opening and closing of the roof panel. An opening or closing position of the side window pane is determined by the position and direction of the swiping gesture of the hand.

In another embodiment of the pane arrangement 200 according to the invention having a window pane 100 according to the invention, the pane arrangement 200 can serve as a windshield of a motor vehicle wherein the upper region can be darkened in steps.

In another alternative embodiment of the pane arrangement 200 according to the invention having a window pane 100 according to the invention, the pane arrangement 200 can serve as a side window pane of a motor vehicle. In such an embodiment, the capacitive switching region 10 controls the opening and closing out the side window pane. An opening or closing position of the side window pane is determined by the position and direction of the swiping gesture of the hand. In addition, closing of the side window can be done via a button control.

Figure 3:
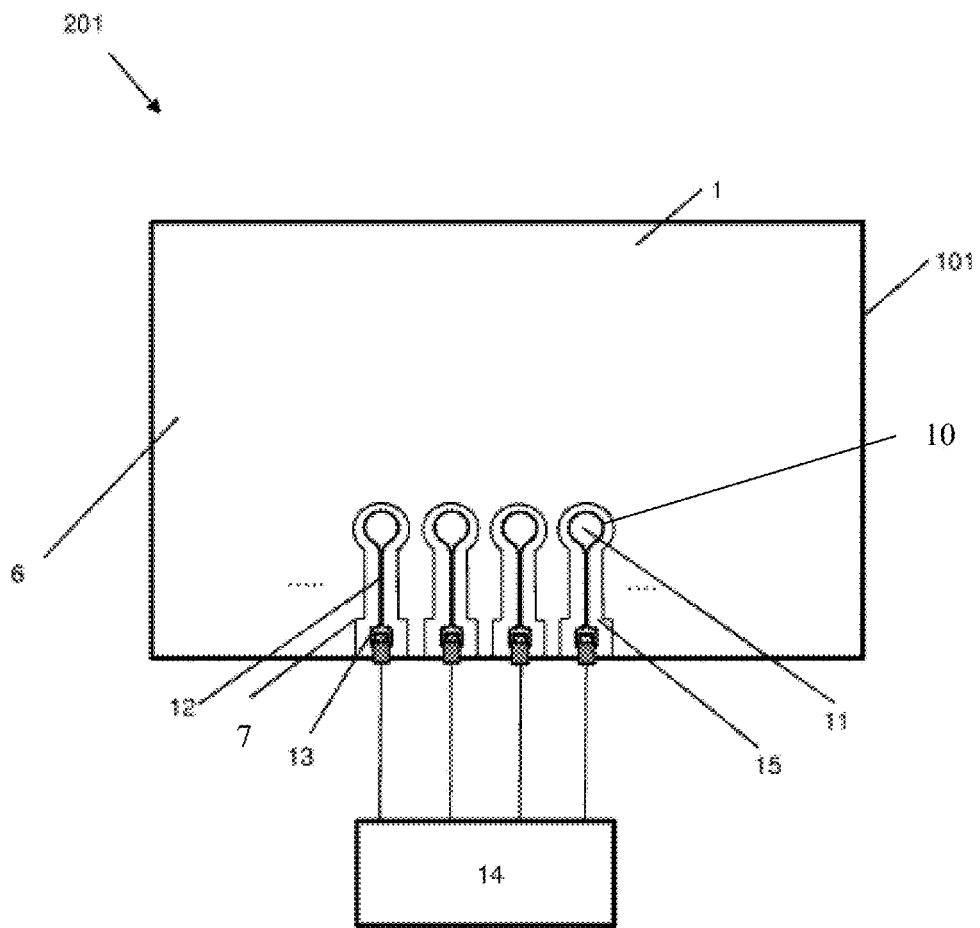
FIG. 3 a plan view of another alternative embodiment of a pane arrangement according to the invention having a composite pane according to the invention and having a plurality of capacitive switching regions.

The exemplary embodiment of a pane arrangement 201 depicted in FIG. 3 substantially corresponds in structure to the composite pane 101 according to the invention having a window pane of FIG. 1A. Here, the composite pane 101 comprises, for example, an inner pane 1 and an outer pane that are joined to one another via an intermediate layer. The inner pane 1 corresponds in its function to the pane 1 of FIG. 1A.

In the central, lower section of the composite pane 101, the low-E coating 6 has a plurality of capacitive switching regions 10 which extend almost in a parallel arrangement over one long side of the composite pane 101.

The low-E coating 6 is divided by coating-free dividing lines 7 into different regions electrically isolated from one another. In each case, a capacitive switching region 10 is electrically divided by a surrounding region 15. Each switching region 10 comprises a detection region 11, which is approx. drop shaped and transitions into a strip-shaped supply line region 12. The width and the length of the detection region 11 is in each case, for example, 40 mm. The width of the supply line region 12 is, for example, 1 mm. The supply line region 12 is connected to a connection region 13. The connection region 13 has a square shape with rounded corners and an edge length of, for example, 12 mm. The length of the supply line region is approx. 48 mm.

In an alternative embodiment of the pane arrangement 201 according to the invention having a window pane 100 according to the invention, the pane arrangement 201 can serve as a side window pane of a motor vehicle and can have capacitive switching regions 10 that are provided for the opening and closing of the side window pane. An opening and closing position of the side window pane is determined by the position and the direction of the swiping gesture of the hand.

Figure 4:
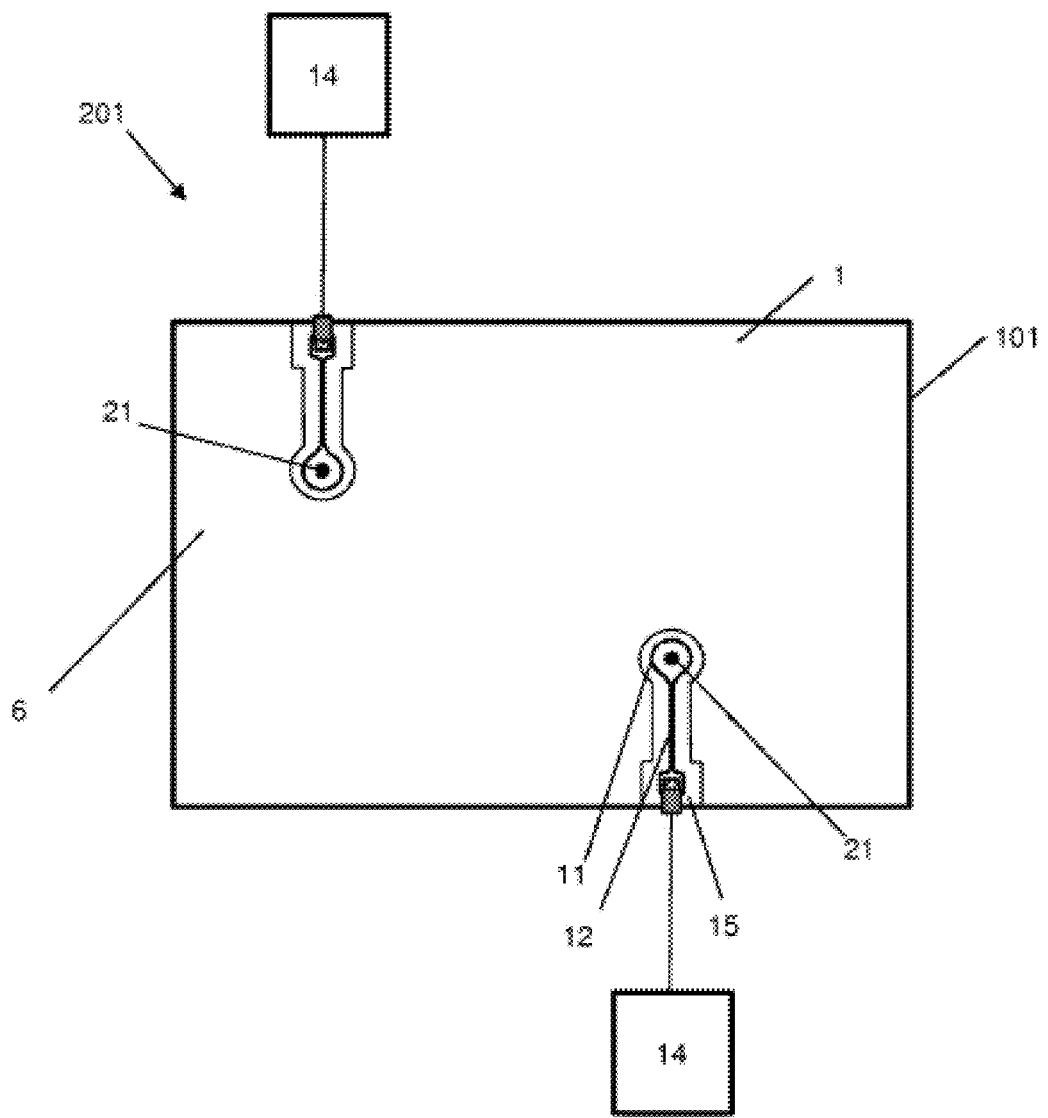
FIG. 4 a plan view of another alternative embodiment of a pane arrangement according the invention having a composite pane according to the invention and having a plurality of capacitive switching regions for controlling a light source, and FIG. 5 a detailed flowchart of an embodiment of the method according to the invention for producing a window pane.

FIG. 4 depicts an alternative embodiment in which a functional intermediate layer was laminated into the composite pane 101 between the inner pane 1 and the outer pane. Here, the functional intermediate layer is, for example, joined to the inner pane 1 and to the outer pane via two thermoplastic intermediate layers made of a PVB film. The functional intermediate layer has, for example, electrically controllable optical transparency and preferably includes a suspended particle device (SPD) layer or an electrochromic intermediate layer.

In addition, the composite pane 101 includes two light-emitting diodes (LED) 21, for example, multicolor LEDs, between the inner pane 1 and the outer pane 4, which were laminated into the composite pane 101. The light of the light-emitting diodes 21 marks the region of the capacitive switching surface 10 and/or serves as an illumination means that can, in each case, be controlled via the associated capacitive switching region 10.

The composite pane 101 serves as a roof panel in a vehicle. In that case, the position and the length of the detection region 12 can be selected such that the driver of the vehicle or the front-seat passenger on their respective seats can comfortably reach detection region 11 of the switching region 10. Of course, even a plurality of capacitive switching surfaces 10 can be arranged for this in the composite pane, for example, one for each vehicle occupant.

The structure and tuning of the sensor electronics system 14 are coordinated such that upon detection of a hand of the driver or the front seat passenger in the detection region 11 of the capacitive switching region 10, a switching signal is triggered.

Alternatively, the position of the capacitive switching surface can also be randomly distributed over the inner surface. The light-emitting diode 21 can be controlled with a gesture movement of the driver or the front seat passenger that is characterized by a direction and position. This has the particular advantage that the luminous ions can be actuated individually and the driver or front seat passenger can select a color value of the light-emitting diode a tuned to his needs.

In another exemplary embodiment of a composite pane 101 according to the invention, the composite pane 101 is implemented as a windshield, wherein the composite pane 101 is shown in a view that is directed toward the inner surface IV of the inner pane 1, i.e., seen from the position of the vehicle's driver. Here, the structure and tuning of the sensor electronics system 14 are coordinated such that for controlling the transparency of the windshield, the vehicle's driver moves his hand into the detection region 11 of the capacitive switching region 10 in order to trigger a switching signal. A capacitive switching region 10 in which generation of the switching signal is possible without contact with the windshield is particularly advantageous. The concentration and direction of the gaze of the vehicle's driver is thus not diverted by the fact that his hand must touch a specific point on the windshield, but rather by extending his hand in the direction of the detection region and reaching the activation region in the vicinity of the inner surface IV, a switching signal is triggered. Another advantage of contactless control consists in that the vehicle's driver does not foul the windshield with fingerprints.

Figure 5:
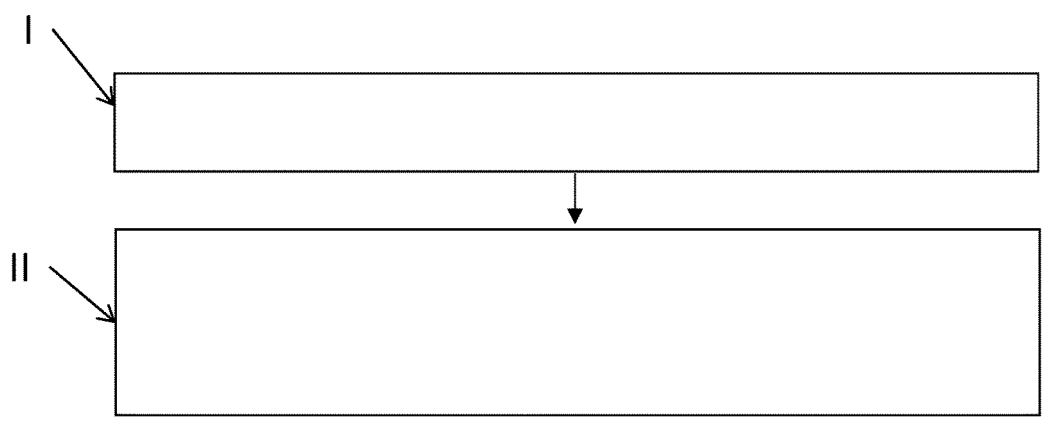

FIG. 5 depicts a flowchart of an exemplary embodiment of the method according to the invention for producing a window pane 100 according to the invention having a capacitive switching region 10. The method according to the invention comprises the following steps:

I. Applying a low-E coating 6 on an inner surface (IV) of a pane 1 and

II. Introducing at least one dividing line 7 that electrically divides the low-E coating 6 into at least one capacitive switching region 10 and at least one surrounding region 15, preferably by laser patterning or by mechanical or chemical ablation.

A pane arrangement 200 having a window pane 100 or a pane arrangement 201 having a composite pane 101, wherein the sensitivity of the sensor electronics system 14 is tuned such that a contactless triggering of the switching operation is possible from an inner surface IV of the window pane 100 or of the composite pane 101 is particularly advantageous and surprising.

This result was unexpected and surprising to the person skilled in the art.

LIST OF REFERENCE CHARACTERS

1 pane, inner pane
5 subregion
6 low-E coating
7 dividing line
10 capacitive switching region
11 detection region
12 supply line region
13 connection region
14 capacitive sensor electronics system
15 surrounding region
17 foil conductor
21 light-emitting diode (LED)
100 window pane
101 composite pane
200, 201 pane arrangement
$d_1$, thickness
A-A' section line
III outer surface of the pane 1 or of the inner pane 1
IV inner surface of the pane 1 or of the inner pane 1

The invention claimed is:

1. A window pane having a plurality of capacitive switching regions, for separating an interior from an external environment, comprising:
   a pane having an inner surface, and
   a coating that is arranged at least partially on the inner surface of the pane,
   wherein
   a capacitive switching region is in each case electrically separated from the coating by at least one coating-free dividing line and is electrically connectable to a sensor electronics system and has a detection region for contactlessly detecting an object moved by a person in an activation region and a direction of movement thereof,
   wherein the detection region has a shape of a rectangle and is implemented in a plurality of linear strip-shaped subregions to enable contactless detection of a position and the direction of movement of the object moved in the activation area, with each subregion having a shape of a rectangle,
   wherein the subregions are arranged at a coating-free distance from each other corresponding to a width of the coating-free dividing line,
   wherein the subregions extend along a longitudinal axis that is parallel to one side of the inner surface,
   wherein the subregions have a length along the longitudinal axis that corresponds to a length of said side of the inner surface,
   wherein the subregions are arranged parallel to one another,
   wherein two adjacent subregions form two electrodes that are capacitively coupled to one another, and
   wherein one of the two adjacent subregions is coupled to ground potential and the other one of the two adjacent subregions is connected to an electric potential.

2. The window pane according to claim 1, wherein the capacitive switching region is provided for generating an electric field that extends within the activation region.

3. The window pane according to claim 1, wherein the activation region has a region parallel to and of the size of the inner surface and a width of 10 cm in the direction of the interior.

4. The window pane according to claim 1, wherein the capacitive switching region has a supply line region, a connection region, and a surrounding region, wherein the supply line region is provided as an electrical connection between the detection region and the connection region and the connection region can be electrically connected to a sensor electronics system.

5. The window pane according to claim 1, wherein the capacitive switching region is provided for generating an electrical signal and/or the detection region includes a light source.

6. A pane arrangement comprising:
a window pane according to claim 1, and
a capacitive sensor electronics system that is electrically connected to the detection region,
wherein the sensitivity of the sensor electronics system is selected such that the sensor electronics system outputs a switching signal upon detection of an object moved by a person in an activation region.

7. A composite pane, comprising:
an inner pane that consists of a pane according to claim 1,
an outer pane having an inner surface, and
at least one intermediate layer that joins the inner surface of the outer pane areally to an outer surface of the inner pane and the capacitive switching region is provided for electrically controlling the optical transparency of the intermediate layer or of an electrochromic intermediate layer.

8. The composite pane according to claim 7, wherein the capacitive switching region is provided for generating an electric field that extends within the activation region, wherein a change in the electric field is caused by the contactless movement of the object in the activation region and the change in the electric field causes a change in said optical transparency, said change in said optical transparency occurring in steps, wherein a step corresponds to one of the subregions.

9. A method for producing a window pane according to claim 1, comprising:
applying a coating on an inner surface of a pane, and
introducing at least one dividing line that electrically divides the coating into a plurality of capacitive switching regions and/or at least one surrounding region.

10. The method according to claim 9, wherein the at least one dividing line is introduced by laser patterning or by mechanical or chemical ablation.

11. The window pane according to claim 1, further comprising a functional layer, wherein the capacitive switching region is provided for generating an electric field that extends within the activation region, wherein a change in the electric field is caused by the contactless movement of the object in the activation region and the change in the electric field causes a change in optical transparency of the functional layer, said change in said optical transparency occurring in steps, wherein a step corresponds to one of the subregions.

12. A method comprising:
providing a window pane that has a plurality of capacitive switching regions, for separating an interior from an external environment, and includes
a pane having an inner surface, and
a coating that is arranged at least partially on the inner surface of the pane,
wherein
a capacitive switching region is in each case electrically separated from the coating by at least one coating-free dividing line and is electrically connectable to a sensor electronics system and has a detection region for contactlessly detecting an object moved by a person in an activation region and a direction of movement thereof,
wherein the detection region has a shape of a rectangle and is implemented in a plurality of linear strip-shaped subregions to enable contactless detection of a position and the direction of movement of the object moved in the activation area, with each subregion having a shape of a rectangle,
wherein the subregions are arranged at a coating-free distance from each other corresponding to a width of the coating-free dividing line,
wherein the subregions extend along a longitudinal axis that is parallel to one side of the inner surface,
wherein the subregions have a length along the longitudinal axis that corresponds to a length of said side of the inner surface,
wherein the subregions are arranged parallel to one another,
wherein two adjacent subregions form two electrodes that are capacitively coupled to one another, and
wherein one of the two adjacent subregions is coupled to ground potential and the other one of the two adjacent subregions is connected to an electric potential, and
installing the window pane in a vehicle of transportation for travel on land, in the air, or on water or as a built-in component in furniture, an appliance, or a building.

13. The method according to claim 12, wherein the vehicle is a motor vehicle.

14. The method according to claim 12, wherein the window pane is a windshield, a rear window, a side window, or a roof panel.

15. The method according to claim 12, wherein the appliance is an electrical heater.

16. A method comprising:
providing a composite pane that includes
an inner pane,
outer pane having an inner surface, and
at least one intermediate layer that joins the inner surface of the outer pane areally to an outer surface of the inner pane,
wherein the inner pane has a plurality of capacitive switching regions, for separating an interior from an external environment, and a coating that is arranged at least partially on an inner surface of the inner pane,
wherein a capacitive switching region is in each case electrically separated from the coating by at least one coating-free dividing line and is electrically connectable to a sensor electronics system and has a detection region for contactlessly detecting an object moved by a person in an activation region and a direction of movement thereof,
wherein the detection region has a shape of a rectangle and is implemented in a plurality of linear strip-shaped subregions to enable contactless detection of a position and the direction of movement of the object moved in the activation area, with each subregion having a shape of a rectangle,
wherein the subregions are arranged at a coating-free distance from each other corresponding to a width of the coating-free dividing line,
wherein the subregions extend along a longitudinal axis that is parallel to one side of the inner surface,
wherein at least one of the subregions has a length along the longitudinal axis that corresponds to a length of said side of the inner surface,
wherein the subregions are arranged parallel to one another,
wherein two adjacent subregions form two electrodes that are capacitively coupled to one another, and
wherein one of the two adjacent subregions is coupled to ground potential and the other one of the two adjacent subregions is connected to an electric potential, and installing the composite pane in a vehicle of transportation for travel on land, in the air, or on water or as a built-in component in furniture, an appliance, or a building.

17. The method according to claim 16, wherein the capacitive switching region is provided for generating an electric field that extends within the activation region, wherein a change in the electric field is caused by the contactless movement of the object in the activation region and the change in the electric field causes a change in optical transparency of the at least one intermediate layer, said change in said optical transparency occurring in steps, wherein a step corresponds to one of the subregions.

* * * * *